United States Patent
Park et al.

(10) Patent No.: US 10,325,722 B2
(45) Date of Patent: Jun. 18, 2019

(54) MULTILAYER ELECTRONIC COMPONENT AND BOARD HAVING THE SAME

(71) Applicant: SAMSUNG ELECTRO-MECHANICS CO., LTD., Suwon-si, Gyeonggi-do (KR)

(72) Inventors: Heung Kil Park, Suwon-si (KR); Gu Won Ji, Suwon-si (KR); Se Hun Park, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/879,134

(22) Filed: Jan. 24, 2018

(65) Prior Publication Data

US 2019/0103223 A1    Apr. 4, 2019

(30) Foreign Application Priority Data

Oct. 2, 2017    (KR) .................. 10-2017-0128503

(51) Int. Cl.
| | |
|---|---|
| H05K 13/04 | (2006.01) |
| H01G 4/248 | (2006.01) |
| H01G 4/30 | (2006.01) |
| H05K 1/18 | (2006.01) |
| H05K 1/11 | (2006.01) |
| H01G 4/005 | (2006.01) |

(52) U.S. Cl.
CPC .............. *H01G 4/248* (2013.01); *H01G 4/30* (2013.01); *H01G 4/005* (2013.01); *H05K 1/111* (2013.01); *H05K 1/181* (2013.01); *H05K 2201/10015* (2013.01)

(58) Field of Classification Search
USPC .......................................... 174/250; 361/303
See application file for complete search history.

(56) References Cited

U.S. PATENT DOCUMENTS

| | | | | |
|---|---|---|---|---|
| 965,992 | A | * | 8/1910 | Dean ...................... H01G 4/015 361/273 |
| 2,899,345 | A | * | 8/1959 | Oshry ..................... C23C 28/02 148/277 |

(Continued)

FOREIGN PATENT DOCUMENTS

| | | | |
|---|---|---|---|
| JP | 2012-204572 A | 10/2012 | |
| JP | 2013191820 A | * 9/2013 | ............... H01G 4/30 |
| JP | 2014-042037 A | 3/2014 | |

*Primary Examiner* — William H. Mayo, III
*Assistant Examiner* — Krystal Robinson
(74) *Attorney, Agent, or Firm* — Morgan Lewis & Bockius LLP

(57) ABSTRACT

A multilayer electronic component includes a capacitor body, a plurality of external electrodes disposed on a mounting surface of the capacitor body to be spaced apart from each other, and a connection terminal including land portions formed of insulators. The land portions have conductor layers formed on surfaces thereof, and are disposed on respective external electrodes. A bridge portion is disposed between land portions adjacent to each other. Cut portions are formed in the land portions. The multilayer electronic component can optionally be mounted on a circuit board having a plurality of electrode pads such that each land portion is mounted to a respective electrode pad of the circuit board.

20 Claims, 6 Drawing Sheets

(56) References Cited

U.S. PATENT DOCUMENTS

| | | | | |
|---|---|---|---|---|
| 3,235,939 A * | 2/1966 | Rodriguez | H01G 4/228 | 156/89.17 |
| 3,648,132 A * | 3/1972 | Rayburn | H01G 4/255 | 29/25.42 |
| 3,809,973 A * | 5/1974 | Hurley | H01G 4/0085 | 29/25.42 |
| 3,914,666 A * | 10/1975 | Schmickl | H01G 2/065 | 361/320 |
| 4,097,911 A * | 6/1978 | Dorrian | H01G 4/0085 | 29/25.42 |
| 4,228,482 A * | 10/1980 | Bouchard | C04B 35/47 | 252/62.9 R |
| 4,353,153 A * | 10/1982 | Prakash | C03C 8/18 | 29/25.42 |
| 4,458,294 A * | 7/1984 | Womack | H01G 4/2325 | 338/309 |
| 4,604,676 A * | 8/1986 | Senda | H01G 4/2325 | 361/309 |
| 4,740,863 A * | 4/1988 | Langlois | H01G 4/232 | 29/25.42 |
| 5,128,827 A * | 7/1992 | Yokotani | H01C 1/142 | 29/25.42 |
| 5,401,910 A * | 3/1995 | Mandai | H01G 4/2325 | 174/250 |
| 5,805,409 A * | 9/1998 | Takahara | H01G 4/2325 | 361/301.4 |
| 5,838,070 A * | 11/1998 | Naruse | H05K 1/111 | 257/779 |
| 6,011,683 A * | 1/2000 | Dat | H01G 4/306 | 361/306.1 |
| 6,144,547 A * | 11/2000 | Retseptor | H01G 4/08 | 361/303 |
| 6,270,613 B1 * | 8/2001 | Nakagawa | H01G 13/006 | 156/233 |
| 6,418,009 B1 * | 7/2002 | Brunette | H01G 4/30 | 361/301.4 |
| 9,336,946 B2 * | 5/2016 | Lee | H01G 4/008 | |
| 9,460,856 B2 * | 10/2016 | Park | H01G 4/30 | |
| 2004/0160751 A1 * | 8/2004 | Inagaki | H01L 21/4857 | 361/763 |
| 2012/0147516 A1 * | 6/2012 | Kim | H01G 4/232 | 361/301.4 |
| 2013/0241361 A1 * | 9/2013 | Lee | H01G 4/30 | 310/366 |
| 2014/0016242 A1 * | 1/2014 | Hattori | H01G 2/06 | 361/303 |
| 2014/0131082 A1 * | 5/2014 | Ahn | H05K 3/3442 | 174/260 |
| 2014/0138136 A1 * | 5/2014 | Ahn | H01G 2/065 | 174/260 |
| 2014/0185186 A1 * | 7/2014 | Lee | H01G 4/30 | 361/303 |
| 2014/0290998 A1 * | 10/2014 | Ahn | H01G 4/30 | 174/260 |
| 2015/0318112 A1 * | 11/2015 | Kwag | H01C 7/10 | 174/260 |

* cited by examiner

MULTILAYER ELECTRONIC COMPONENT AND BOARD HAVING THE SAME

CROSS-REFERENCE TO RELATED APPLICATION(S)

This application claims benefit of priority to Korean Patent Application No. 10-2017-0128503 filed on Oct. 2, 2017 in the Korean Intellectual Property Office, the disclosure of which is incorporated herein by reference in its entirety.

BACKGROUND

1. Field

The present disclosure relates to a multilayer electronic component and a board having the same.

2. Description of Related Art

A multilayer capacitor, an illustrative type of multilayer electronic component, is formed of a dielectric material, and such a dielectric material may have piezoelectric properties causing the capacitor to be deformed in synchronization with a voltage applied thereto.

When a period of the applied voltage is within an audio frequency band, displacement of the dielectric material can cause vibrations that are transferred to a circuit board through solders, and vibrations of the circuit board are thus experienced as noise. Such noise is known as acoustic noise.

In a case in which a device is operated in a quiet environment, a user may experience the acoustic noise as abnormal sound and believe that a fault has occurred in the device.

In addition, in a device forming part of an audio circuit, the acoustic noise may overlap with an audio output such that quality of the device may be deteriorated.

In addition, in a case in which piezoelectric vibrations of the multilayer capacitor are generated in a high frequency region of 20 kHz or more, separately from the acoustic noise recognized by a user, the vibrations may cause malfunctions in various sensors used in information technology (IT) and industry/electrical component fields.

Meanwhile, external electrodes of the multilayer capacitor and the circuit board are connected to each other by solders. In this case, the solders may be formed in an inclined state at a predetermined height along surfaces of the external electrodes on opposite side surfaces or opposite end surfaces of a capacitor body.

Here, as a volume and a height of the solders are increased, the vibrations of the multilayer capacitor are more easily transferred to the circuit board, such that a magnitude of the generated acoustic noise is increased.

SUMMARY

An aspect of the present disclosure may provide a multilayer electronic component having reduced acoustic noise in an audio frequency region less than 20 kHz and reduced high frequency vibrations in a high frequency region of 20 kHz or more. A board having the multilayer electronic component mounted thereon is further provided.

According to an aspect of the present disclosure, a multilayer electronic component may include a capacitor body, a plurality of external electrodes disposed on a mounting surface of the capacitor body to be spaced apart from each other, and a connection terminal including land portions formed of insulators. The land portions may have conductor layers formed on surfaces thereof and may be disposed on respective external electrodes of the plurality of external electrodes. A bridge portion may be disposed between land portions adjacent to each other, and cut portions may be disposed in the land portions.

The capacitor body may have a first surface corresponding to the mounting surface, a second surface opposing the first surface, and third and fourth surfaces connected to the first and second surfaces and opposing each other. The capacitor body may include first and second internal electrodes each having one end alternately exposed through the third and fourth surfaces. The external electrodes may include first and second external electrodes including, respectively, first and second band portions disposed on the first surface to be spaced apart from each other and first and second connected portions each extended from the first and second band portions respectively to the third and fourth surfaces respectively and each connected to the first and second internal electrodes respectively. The land portions may include first and second land portions respectively disposed on the first and second band portions and respectively having first and second cut portions disposed in opposing surfaces thereof respectively facing the third and fourth surfaces.

The bridge portion may have a width smaller than a width of the land portion, and may have a linear shape.

The bridge portion may have a cross shape.

The capacitor body may have fifth and sixth surfaces connected to the first and second surfaces, connected to the third and fourth surfaces, and opposing each other, the first external electrode may be further extended to portions of the second, fifth, and sixth surfaces of the capacitor body, and the second external electrode may be further extended to portions of the second, fifth, and sixth surfaces of the capacitor body.

A solder accommodating portion may be provided by the cut portion on one surface of the external electrode.

The capacitor body may have a first surface corresponding to the mounting surface, a second surface opposing the first surface, and third and fourth surfaces connected to the first and second surfaces and opposing each other. The capacitor body may include first and second internal electrodes alternately disposed with respective dielectric layers interposed therebetween. The external electrodes may include first, third, and second external electrodes disposed on the first surface to be spaced apart from one another in a direction connecting the third and fourth surfaces to each other, and each of the first internal electrodes may have first and second lead portions exposed through the first surface of the capacitor body to thus be connected, respectively, to the first and second external electrodes. Each of the second internal electrodes may have a third lead portion disposed between the first and second lead portions and exposed through the first surface of the capacitor body to thus be connected to the third external electrode. The land portions may include first, second, and third land portions disposed, respectively, on the first, second, and third external electrodes. First and second cut portions may be disposed, respectively, in opposing surfaces of the first and second land portions facing the third and fourth surfaces.

The bridge portion may include a first bridge portion disposed between the first land portion and the third land portion and a second bridge portion disposed between the second land portion and the third land portion, and the first and second bridge portions may be formed to each have a width smaller than a width of the first, second, and third land portions and to each have a linear shape.

The capacitor body may have fifth and sixth surfaces connected to the first and second surfaces, connected to the third and fourth surfaces, and opposing each other. The first external electrode may be further extended to the third surface and portions of the second, fifth, and sixth surfaces of the capacitor body, and the second external electrode may be further extended to the fourth surface and portions of the second, fifth, and sixth surfaces of the capacitor body. The third external electrode may be further extended to portions of the fifth, sixth, and second surfaces of the capacitor body.

The capacitor body may have a first surface corresponding to the mounting surface, a second surface opposing the first surface, third and fourth surfaces connected to the first and second surfaces and opposing each other, and fifth and sixth surfaces connected to the first and second surfaces, connected to the third and fourth surfaces, and opposing each other. The capacitor body may include first and second internal electrodes alternately disposed with respective dielectric layers interposed therebetween. The external electrodes may include first, third, and second external electrodes disposed on the first surface to be spaced apart from one another in a direction connecting the third and fourth surfaces to each other and each extended to portions of the fifth and sixth surfaces of the capacitor body. Each of the first internal electrodes may have first and second lead portions exposed through the fifth or sixth surface of the capacitor body to thus be connected, respectively, to the first and second external electrodes. Each of the second internal electrodes may have a third lead portion disposed between the first and second lead portions and exposed through the fifth or sixth surface of the capacitor body to thus be connected to the third external electrode. The land portions may include first, second, and third land portions disposed, respectively, on the first, second, and third external electrodes. First and second cut portions may be formed in opposing surfaces of the first and second land portions, respectively, and facing in the direction of the third and fourth surfaces, respectively.

According to another aspect of the present disclosure, a board having a composite electronic component may include a circuit board having a plurality of electrode pads disposed on one surface thereof, and the multilayer electronic component as described above mounted on the circuit board so that the land portions are connected to respective electrode pads of the plurality of electrode pads.

According to another aspect of the present disclosure, a multilayer electronic component may include a capacitor body, a plurality of external electrodes disposed on a mounting surface of the capacitor body to be spaced apart from each other, and a connection terminal including land portions formed of insulators. The capacitor body may include a plurality of first and second internal electrodes alternately disposed therein with dielectric layers disposed therebetween. The land portions may have conductor layers formed on surfaces thereof and may be disposed on respective external electrodes of the plurality of external electrodes. Each land portion may have an outline including a concave portion.

The concave portions of the land portions may be formed in side surfaces of the land portions facing away from each other.

The plurality of external electrodes may include first and second external electrodes each extending onto opposing first and second end surfaces of the capacitor body. The concave portion of one land portion may be formed in a side surface of the one land portion facing the first end surface, and the concave portion of another land portion may be formed in a side surface of the other land portion facing the second end surface.

The connection terminal may further include a bridge portion disposed between land portions adjacent to each other, and the concave portion of each land portion may be formed in a side surface of the land portion facing away from the bridge portion.

The external electrodes may be spaced apart from each other in a length direction of the capacitor body, and the bridge portion may have a width measured in a direction orthogonal to the length direction that is smaller than a width of the land portions measured in the direction orthogonal to the length direction.

The bridge portion may have a '+' shape.

The plurality of external electrodes may include three external electrodes spaced apart from each other on the mounting surface of the capacitor body.

Each external electrode may extend onto at least 4 outer surfaces of the capacitor body.

The plurality of external electrodes may include three external electrodes spaced apart from each other on the mounting surface of the capacitor body, and each first internal electrode may contact at least two of the external electrodes.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will be described in detail with reference to the accompanying drawings.

Figure 1:
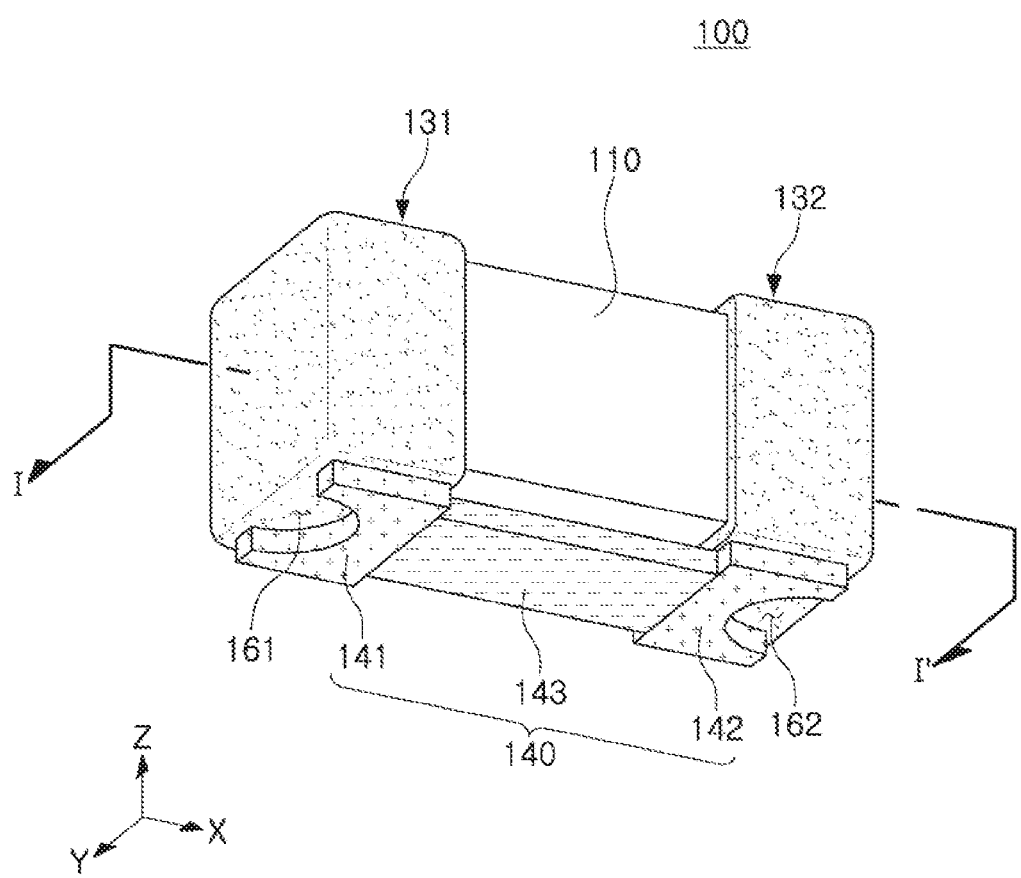
FIG. 1 is a perspective view illustrating a multilayer electronic component according to an exemplary embodiment.
Figure 2:
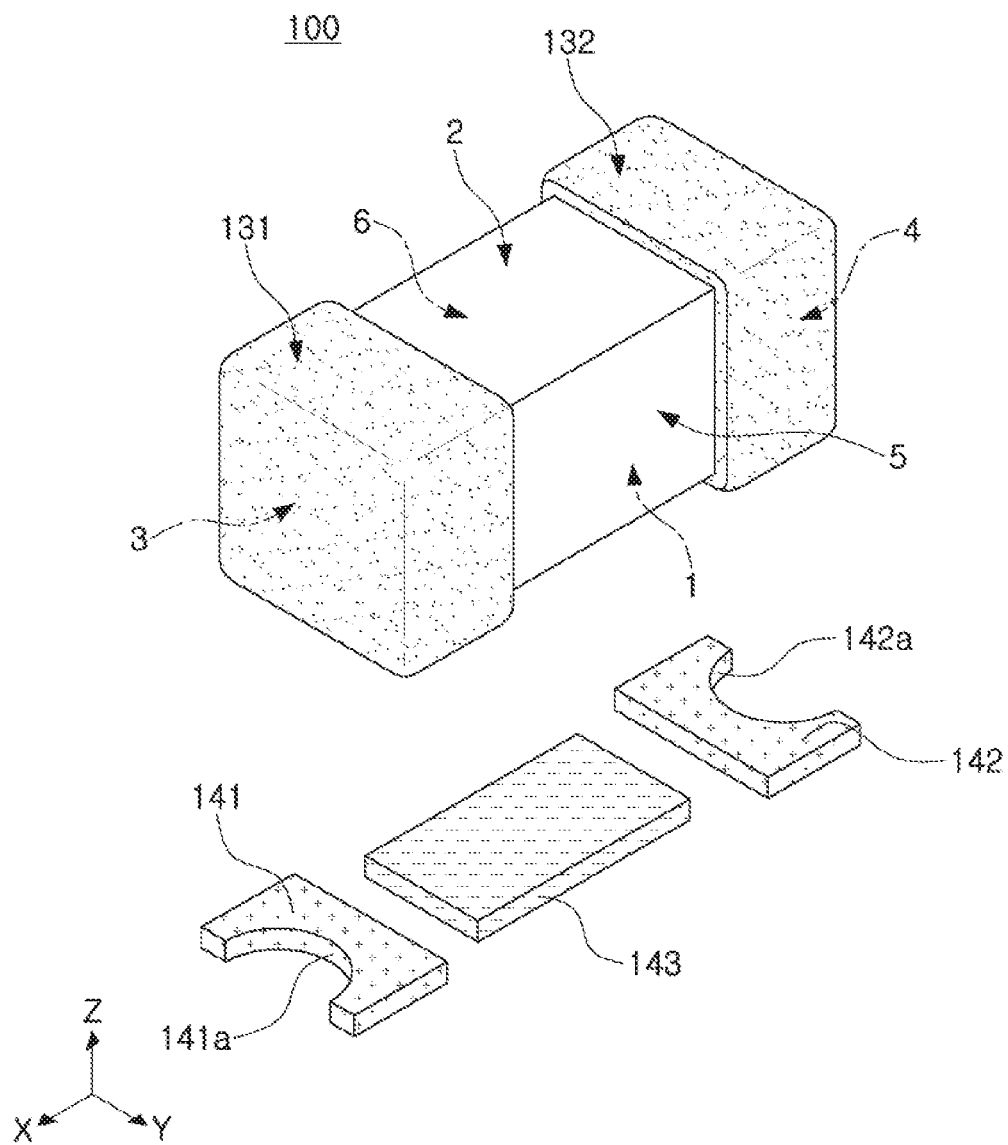
FIG. 2 is an exploded perspective view illustrating the multilayer electronic component of FIG. 1 from which a connection terminal is separated.
Figure 3A:
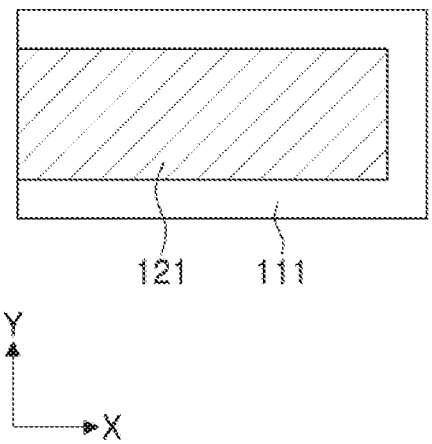
FIGS. 3A and 3B are plan views respectively illustrating first and second internal electrodes of the multilayer electronic component according to an exemplary embodiment.
Figure 3B:
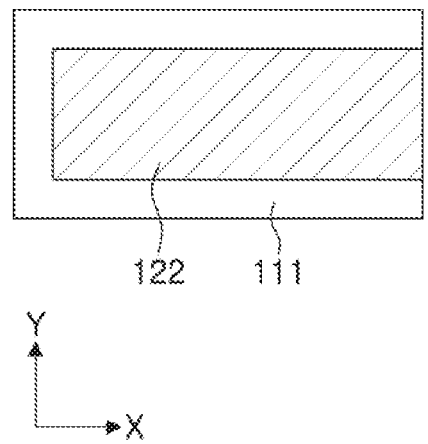
Figure 4:
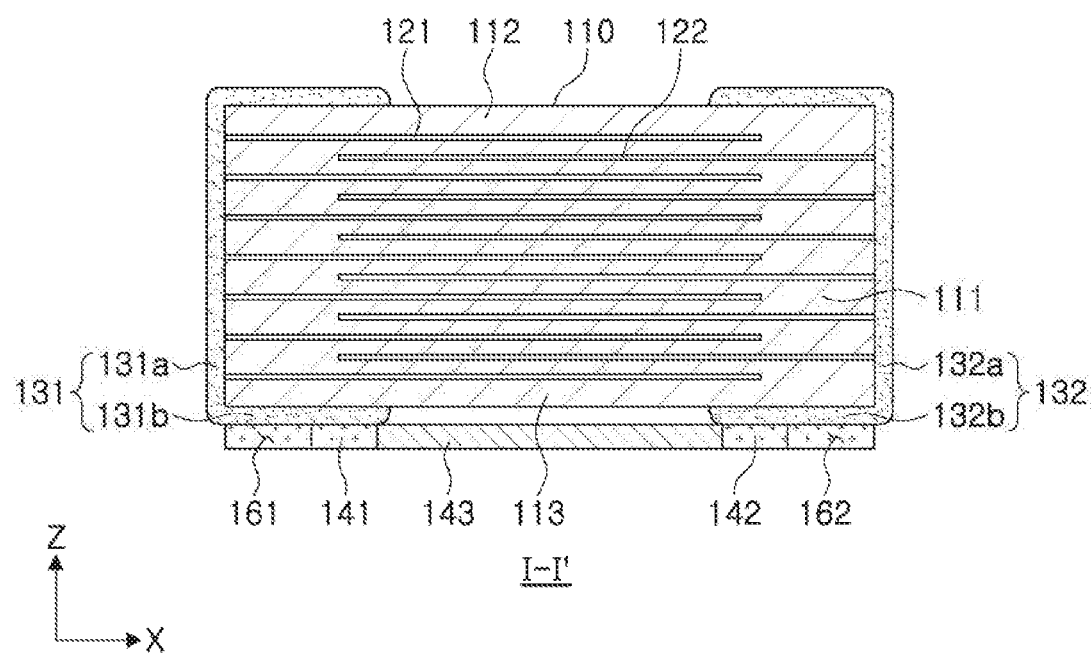
FIG. 4 is a cross-sectional view taken along line I-I' of FIG. 1.

FIG. 1 is a perspective view illustrating a multilayer electronic component according to an exemplary embodiment, FIG. 2 is an exploded perspective view illustrating the multilayer electronic component of FIG. 1 from which a connection terminal is separated, FIGS. 3A and 3B are plan views illustrating, respectively, first and second internal electrodes of the multilayer electronic component according to an exemplary embodiment, and FIG. 4 is a cross-sectional view taken along line I-I' of FIG. 1.

Referring to FIGS. 1, 2, 3A, 3B, and 4, a multilayer electronic component 100 according to an exemplary embodiment may include a capacitor body 110, a plurality of external electrodes disposed on a mounting surface of the capacitor body 110 to be spaced apart from each other, and a connection terminal 140 including land portions disposed on respective external electrodes. The connection terminal 140 further includes a bridge portion disposed between land portions adjacent to each other, and cut portions are formed in the land portions.

Hereinafter, directions of the capacitor body 110 will be defined in order to clearly describe exemplary embodiments in the present disclosure. X, Y and Z directions shown in the drawings refer to a length direction, a width direction, and a thickness direction, respectively, of the capacitor body 110 in the orientation as shown. In addition, in the present exemplary embodiment, the thickness direction refers to a stacked direction in which dielectric layers are stacked in the capacitor body 110.

The capacitor body 110 may be formed by stacking and then sintering a plurality of dielectric layers 111 in the Z direction, and may include the plurality of dielectric layers 111 and a plurality of first and second internal electrodes 121 and 122 alternately disposed in the Z direction with each of the dielectric layers 111 interposed therebetween.

In addition, covers 112 and 113 having a predetermined thickness may be further formed, respectively, on both sides of the capacitor body 110 in the Z direction.

Here, the respective adjacent dielectric layers 111 of the capacitor body 110 may be integrated with each other so that boundaries therebetween are not readily apparent.

The capacitor body 110 may have a substantially hexahedral shape. However, a shape of the capacitor body 110 is not limited thereto.

In the present exemplary embodiment, for convenience of explanation, first and second surfaces 1 and 2 of the capacitor body 110 refer to opposite surfaces of the capacitor body 110 opposing each other in the Z direction, third and fourth surfaces 3 and 4 of the capacitor body 110 refer to opposite surfaces of the capacitor body 110 connected to the first and second surfaces 1 and 2 and opposing each other in the X direction, and fifth and sixth surfaces 5 and 6 of the capacitor body 110 refer to opposite surfaces of the capacitor body 110 connected to the first and second surfaces 1 and 2, connected to the third and fourth surfaces 3 and 4, and opposing each other in the Y direction. In the present exemplary embodiment, the first surface 1 may be amounting surface.

In addition, the dielectric layer 111 may include a ceramic material having a high dielectric constant, for example, a barium titanate ($BaTiO_3$) based ceramic powder, or the like. However, a material of the dielectric layer 111 is not limited thereto.

An example of the barium titanate ($BaTiO_3$) based ceramic powder may include $(Ba_{1-x}Ca_x)TiO_3$, $Ba(Ti_{1-y}Ca_y)O_3$, $(Ba_{1-x}Ca_x)(Ti_{1-y}Zr_y)O_3$, $Ba(Ti_{1-y}Zr_y)O_3$, or the like, in which Ca, Zr, or the like, is partially dissolved in $BaTiO_3$. However, an example of the barium titanate ($BaTiO_3$) based ceramic powder is not limited thereto.

In addition, the dielectric layer 111 may further include a ceramic additive, an organic solvent, a plasticizer, a binder, a dispersant, and the like, in addition to the ceramic powder.

As the ceramic additive, for example, a transition metal oxide or a transition metal carbide, a rare earth element, magnesium (Mg), aluminum (Al), or the like, may be used.

The first and second internal electrodes 121 and 122, which are electrodes having different polarities, may be alternately disposed to face each other in the Z direction with each of the dielectric layers 111 interposed therebetween, and one end of each of the first internal electrodes 121 may be exposed through the third surface 3 and one end of each of the second internal electrodes 122 may be exposed through the fourth surface 4 of the capacitor body 110.

Here, the first and second internal electrodes 121 and 122 may be electrically insulated from each other by the dielectric layers 111 disposed therebetween.

The end portions of the first and second internal electrodes 121 and 122 alternately exposed through the third and fourth surfaces 3 and 4 of the capacitor body 110, respectively, may be electrically connected to connection portions of first and second external electrodes 131 and 132 disposed on the third and fourth surfaces 3 and 4 of the capacitor body 110 to be described below, respectively.

Here, the first and second internal electrodes 121 and 122 may be formed of a conductive metal, for example, a material such as nickel (Ni), a nickel (Ni) alloy, or the like. However, materials of the first and second internal electrodes 121 and 122 are not limited thereto.

According to the configuration as described above, when predetermined voltages are applied to the first and second external electrodes 131 and 132, electric charges may be accumulated between the first and second internal electrodes 121 and 122 facing each other.

Here, a capacitance of the multilayer electronic component 100 may be in proportion to an area over which the first and second internal electrodes 121 and 122 overlap each other in the Z direction.

In the present exemplary embodiment, external electrodes may include the first and second external electrodes 131 and 132.

The first and second external electrodes 131 and 132 may be disposed on and/or extend onto the first surface 1 of the capacitor body 110, i.e. the mounting surface of the capacitor body 110, to be spaced apart from each other in the X direction. Voltages having different polarities may be provided to the first and second external electrodes 131 and 132, respectively, and the first and second external electrodes 131 and 132 may be electrically connected to the exposed portions of the first and second internal electrodes 121 and 122, respectively.

Plating layers may be formed on surfaces of the first and second external electrodes 131 and 132, if desired.

For example, the first and second external electrodes 131 and 132 may include conductive layers, nickel (Ni) plating layers formed on the conductive layers, and tin (Sn) plating layers formed on the nickel plating layers, respectively.

The first external electrode 131 may include a first connected portion 131a and a first band portion 131b.

The first band portion 131b may be disposed on a portion of the first surface 1 of the capacitor body 110, and may be electrically connected to a first land portion of a connection terminal to be described below.

The first connected portion 131a may be extended from the first band portion 131b to the third surface 3 of the capacitor body 110, and may be connected to the first internal electrodes 121 exposed through the third surface 3 of the capacitor body 110.

Here, the first band portion 131*b* may be further formed on a portion of the second surface 2 of the capacitor body 110 and portions of the fifth and sixth surfaces 5 and 6 of the capacitor body 110, if desired, in order to improve adhesion strength, or the like.

The second external electrode 132 may include a second connected portion 132*a* and a second band portion 132*b*.

The second band portion 132*b* may be disposed on the first surface 1 of the capacitor body 110 to be spaced apart from the first band portion 131*b* in the X direction, and may be electrically connected to a second land portion of a connection terminal to be described below.

The second connected portion 132*a* may be extended from the second band portion 132*b* to the fourth surface 4 of the capacitor body 110, and may be connected to the second internal electrodes 122 exposed through the fourth surface 4 of the capacitor body 110.

Here, the second band portion 132*b* may be further formed on a portion of the second surface 2 of the capacitor body 110 and portions of the fifth and sixth surfaces 5 and 6 of the capacitor body 110, if desired, in order to improve adhesion strength, or the like.

The connection terminal 140 may include a plurality of land portions 141 and 142 and a bridge portion 143 disposed between the land portions 141 and 142 adjacent to each other.

In the present exemplary embodiment, the number of land portions may correspond to the number of external electrodes, and the land portions may include first and second land portions 141 and 142 disposed to be spaced apart from each other in the X direction. The first and second land portions 141 and 142 may be disposed on the first band portion 131*b* of the first external electrode 131 and the second band portion 132*b* of the second external electrode 132, respectively.

Here, the band portions and the land portions may be bonded to each other using a conductive adhesive such as a high melting-point solder, a conductive paste, or the like.

The first land portion 141 may be formed of an insulator, for example, an insulating substrate or a circuit board such as FR4, a flexible printed circuit board (FPCB), but is not limited thereto. In addition, conductor layers formed of a conductive metal may be formed on surfaces of the first land portion 141. The conductor layers may be formed of plating layers.

In addition, a first cut portion 141*a* may be formed in the first land portion 141. The first cut portion 141*a* may be formed in one or more circumferential surfaces of the first land portion 141 connecting between opposite surfaces of the first land portion 141 opposing each other in the Z direction. The first cut portion 141*a* can be a concave portion formed in the circumferential surface of the first land portion 141.

Therefore, a first solder accommodating portion 161 may be provided as a solder pocket on the first band portion 131*b* of the first external electrode 131 on the first surface 1 of the capacitor body 110.

In the present exemplary embodiment, the first cut portion 141*a* may be formed to be opened toward the third surface 3 of the capacitor body 110 in the X direction. Here, the first cut portion 141*a* may have a curved surface or outline, but is not limited thereto. In one example, the first cut portion 141*a* may correspond to a semi-circular portion that is removed from a first land portion 141 that would otherwise have a hexahedral shape.

The second land portion 142 may be formed of an insulator, for example, an insulating substrate or a circuit board such as FR4, a flexible printed circuit board (FPCB), but is not limited thereto. In addition, conductor layers formed of a conductive metal may be formed on surfaces of the second land portion 142. The conductor layers may be formed of plating layers.

In addition, a second cut portion 142*a* may be formed in the second land portion 142. The second cut portion 142*a* may be formed in one or more circumferential surfaces of the second land portion 142 connecting between opposite surfaces of the second land portion 142 opposing each other in the Z direction. The second cut portion 142*a* can be a concave portion formed in the circumferential surface of the second land portion 142.

Therefore, a second solder accommodating portion 162 may be provided as a solder pocket on the second band portion 132*b* of the second external electrode 132 on the first surface 1 of the capacitor body 110.

In the present exemplary embodiment, the second cut portion 142*a* may be formed to be opened toward the fourth surface 4 of the capacitor body 110 in the X direction. Here, the second cut portion 142*a* may be formed to face away from the first cut portion 141*a* in the X direction. In addition, the second cut portion 142*a* may have a curved surface, but is not limited thereto.

When the conductor layers are formed on all of the circumferential surfaces of the first and second land portions 141 and 142 as in the present exemplary embodiment, soldering may be performed on all of the circumferential surfaces of the first and second land portions 141 and 142 including inner portions of the first and second cut portions 141*a* and 142*a* in a soldering process, such that a misalignment level in a position between the multilayer electronic component and a circuit board at the time of mounting the multilayer electronic component on the circuit board may be suppressed. In addition, bonded areas between the multilayer electronic component and solders may be increased at the time of performing the soldering to improve adhesion strength of the multilayer electronic component.

In addition, the first and second land portions 141 and 142 of the connection terminal 140 may allow the capacitor body 110 to be spaced apart from the circuit board by a predetermined distance to thus suppress piezoelectric vibrations generated from the capacitor body 110 from being introduced into the circuit board.

The bridge portion 143 may be formed of an insulator, and may be disposed between the first and second land portions 141 and 142 in the X direction. For example, the bridge portion 143 may be formed of an insulating substrate or a circuit board such as FR4, an FPCB, but is not limited thereto.

The first and second land portions 141 and 142 are positioned at opposite ends of the bridge portion 143, such that the bridge portion 143 may serve to easily adjust attached positions of the first and second land portions 141 and 142 when the connection terminal 140 is attached to the first and second external electrodes 131 and 132.

Here, a width of the bridge portion 143 may be smaller than those of the first and second land portions 141 and 142 (e.g., measured in the width direction Y). In addition, the bridge portion 143 according to the present exemplary embodiment may be formed to have a linear shape.

Therefore, the bridge portion 143 may serve as a partition wall bisecting the first surface 1 of the capacitor body 110 in the Y direction between the first and second land portions 141 and 142. When the multilayer electronic component is mounted on the circuit board, solders introduced onto the first surface of the capacitor body 110 may be prevented from forming solder fillets extending in the Z direction because of the bridge portion 143, resulting in a further reduction of acoustic noise.

In addition, when the bridge portion 143 is disposed between the first and second land portions 141 and 142 and the first and second cut portions 141a and 142a are formed to be opened toward outer surfaces of the capacitor body and face away from each other in the X direction as in the present exemplary embodiment, a spacing distance for insulation between the first and second land portions 141 and 142 may be maintained by a length of the bridge portion 143 to prevent a short-circuit from being generated in the multilayer electronic component 100. Such a short-circuit preventing effect may be more effective particularly in a multilayer electronic component having a small size.

Here, a length of the bridge portion 143 in the X direction may be appropriately adjusted in consideration of adhesion strength of the first and second land portions 141 and 142. For example, in a case of intending to increase the adhesion strength, sizes of the land portions and the length of the bridge portion may be reduced, and in a case of intending to improve the short-circuit preventing effect, or the like, since the multilayer electronic component has a small size, the length of the bridge portion may be relatively increased.

Figure 5:
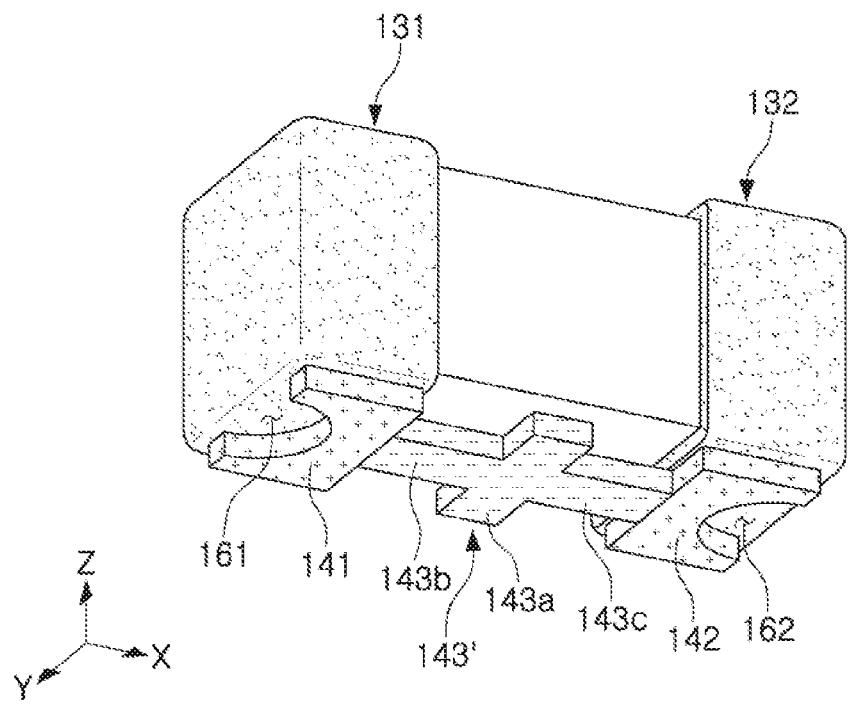
FIG. 5 is a perspective view illustrating a modified example of a bridge portion in the multilayer electronic component according to an exemplary embodiment.

Meanwhile, as illustrated in FIG. 5, a bridge portion 143' may be formed to have a cross or '+' shape.

In this case, the bridge portion 143' may include a body portion 143a disposed in a linear shape in the Y direction on the first surface 1 of the capacitor body 110, a first connecting portion 143b extended from the body portion 143a toward the first land portion 141 in the X direction to connect the first land portion 141 and the body portion 143a to each other, and a second connecting portion 143c extended from the body portion 143a toward the second land portion 142 in the X direction to connect the second land portion 142 and the body portion 143a to each other.

The body portion 143a may serve as a partition wall bisecting the first surface 1 of the capacitor body 110 in the X direction, and the first and second connecting portions 143b and 143c may serve as a partition wall again bisecting the first surface 1 of the capacitor body 110 in the Y direction.

Here, since the body portion 143a serves as an insulating partition wall in the X direction, generation of a short-circuit due to connection between the first and second land portions 141 and 142 caused by spreading of solders, or the like, may be more effectively prevented.

The connection terminal according to the present exemplary embodiment may be manufactured by the following method.

First, a plurality of connection terminals may be patterned on a base board.

Then, land portions having cut portions and conductor layers may be formed in the respective connection terminals. In this case, in order to form the conductor layers on upper and lower surfaces and the cut portions of the land portions and on circumferential surfaces of the land portion, a process of cutting portions as small as possible and then exposing the remaining surfaces formed of a non-conductor through additional processing may be performed.

In this case, the connection terminals need to be maintained in a state in which they are connected to the base board until the surfaces formed of the non-conductor are exposed through additional processing, and in the present exemplary embodiment, the bridge portion 143' may perform such a role.

When a process for the land portions is completed, the base board may be attached to a transfer tape, or the like, to fix the respective connection terminals not to be out of appropriate positions.

Then, a cutting process may be performed together with portions of the tape to complete the connection terminals individually separated from the base board. In the present exemplary embodiment, since only portions of the body portions 143a of the bridge portions 143' are cut when the connection terminals are separated from the base board, work efficiency may be improved.

Then, positions of multilayer capacitors may be aligned in a state in which the connection terminals and the base board are simultaneously adhered to the transfer tape, and the multilayer capacitors may be bonded to the base board through solders.

Figure 6:
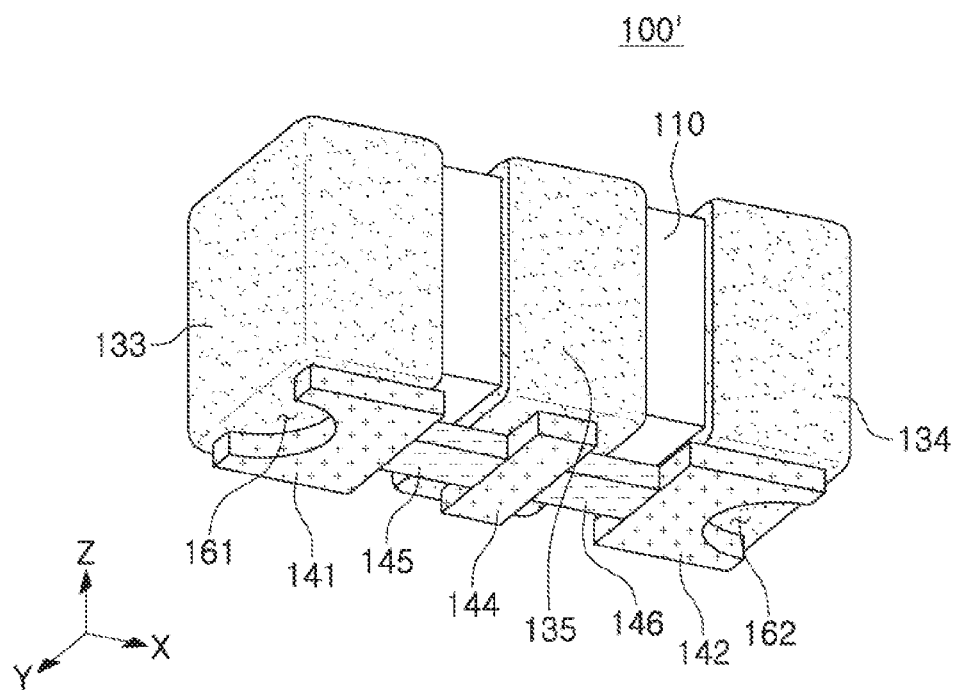
FIG. 6 is a perspective view illustrating a multilayer electronic component according to another exemplary embodiment.
Figure 7A:
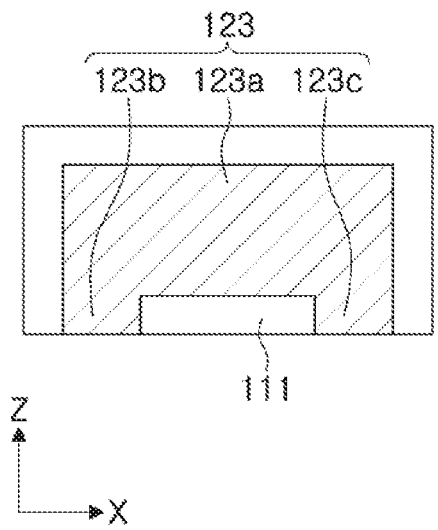
FIGS. 7A and 7B are plan views respectively illustrating first and second internal electrodes of the multilayer electronic component according to the other exemplary embodiment.
Figure 7B:
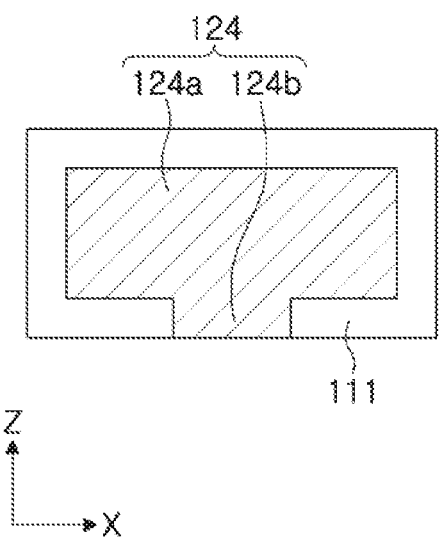

FIG. 6 is a perspective view illustrating a multilayer electronic component according to another exemplary embodiment, and FIGS. 7A and 7B are plan views illustrating, respectively, first and second internal electrodes of the multilayer electronic component according to another exemplary embodiment.

Here, a description of contents similar to the contents of the exemplary embodiment described above is omitted in order to avoid an overlapped description.

Referring to FIGS. 6, 7A, and 7B, a multilayer electronic component 100' according to another exemplary embodiment may have a structure in which first to third external electrodes 133 to 135 are disposed on the first surface 1 of the capacitor body 110 to be spaced apart from one another in the X direction.

Figure 7C:
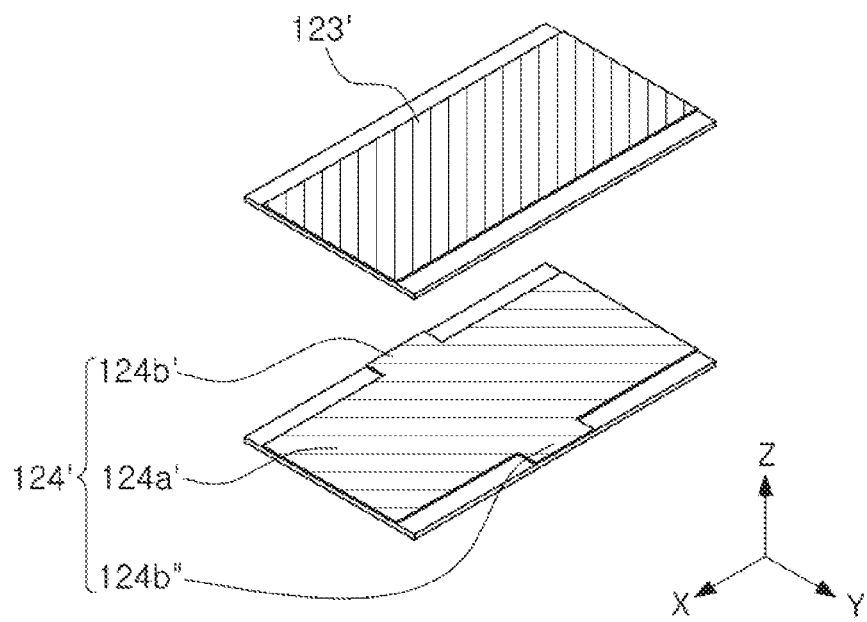
FIG. 7C is plan views respectively illustrating, first and second internal electrodes of the multilayer electronic component according to the other exemplary embodiment.

A case in which a plurality of internal electrodes are stacked in the Y direction of the capacitor body is hereinafter illustrated and is described as an example of the multilayer electronic component, but the present disclosure is not limited thereto. For example, referring to FIG. 7C, the first and second internal electrodes 123' and 124' may alternatively be stacked in the Z direction of the capacitor body 110. In the case of the first and second internal electrodes 123' and 124' stacked in the Z direction, both end portions of the first internal electrodes 123' may be exposed through the third and fourth surfaces 3 and 4 of the capacitor body 110, respectively. Further, the second internal electrode 124' may include a second body portion 124a' and third and fourth lead portions 124b' and 124b" are exposed through the fifth and sixth surfaces 5 and 6 of the capacitor body 110, respectively.

In the present exemplary embodiment, a first internal electrode 123 may include a first body portion 123a and first and second lead portions 123b and 123c.

The first and second lead portions 123b and 123c may be extended from the first body portion 123a to be exposed through the first surface 1 of the capacitor body 110, and be disposed to be spaced apart from each other in the X direction.

A second internal electrode 124 may include a second body portion 124a overlapping the first body portion 123a in the stacking direction (e.g., Y direction) and a third lead portion 124b extended from the second body portion 124a to be exposed through the first surface 1 of the capacitor body 110.

Here, the third lead portion 124b may be disposed between the first lead portion 123b and the second lead portion 123c in the X direction.

The first external electrode 133 and the second external electrode 134 may be disposed on the first surface 1 of the capacitor body 110 to be spaced apart from each other in the X direction, and the third external electrode 135 may be disposed between the first external electrode 133 and the second external electrode 134 in the X direction on the first surface 1 of the capacitor body 110.

In addition, the first lead portion 123b may be in contact with and electrically connected to the first external electrode 133, the second lead portion 123c may be in contact with and electrically connected to the second external electrode 134, and the third lead portion 124b may be in contact with and electrically connected to the third external electrode 135.

Here, in order to improve adhesion strength, the first external electrode 133 may be extended to the third surface 3 and portions of the second, fifth, and sixth surfaces 2, 5, and 6 of the capacitor body 110, the second external electrode 134 may be extended to the fourth surface 4 and portions of the second, fifth, and sixth surfaces 2, 5, and 6 of the capacitor body 110, and the third external electrode 135 may be extended to portions of the second, fifth, and sixth surfaces 2, 5, and 6 of the capacitor body 110.

In addition, in the multilayer electronic component 100' according to the present exemplary embodiment, a connection terminal may include first to third land portions 141, 142, and 144 corresponding to the first to third external electrodes 133, 134, and 135, respectively. That is, the first to third land portions 141, 142, and 144 may be disposed on the first to third external electrodes 133, 134, and 135, respectively, and be electrically connected to the first to third external electrodes 133, 134, and 135, respectively.

Here, the band portions and the land portions may be bonded to each other using a conductive adhesive such as a high melting-point solder, a conductive paste, or the like.

In addition, first and second cut portions may be formed, respectively, in opposite surfaces of the first and second land portions 141 and 142 facing each other in the X direction.

In addition, in the present exemplary embodiment, a bridge portion may include a first bridge portion 145 and a second bridge portion 146.

The first bridge portion 145 may be disposed between the first land portion 141 and the third land portion 144, and the second bridge portion 146 may be disposed between the second land portion 142 and the third land portion 144.

Here, widths (e.g., measured in the Y direction) of the first and second bridge portions 145 and 146 may be smaller than those of the first to third land portions 141, 142, and 144. In addition, the first and second bridge portions 145 and 146 according to the present exemplary embodiment may be formed to have a linear shape.

The first and second bridge portions 145 and 146 may serve as partition walls to reduce heights of solder fillets formed on walls of the multilayer electronic component, resulting in reduction of acoustic noise.

Figure 8:
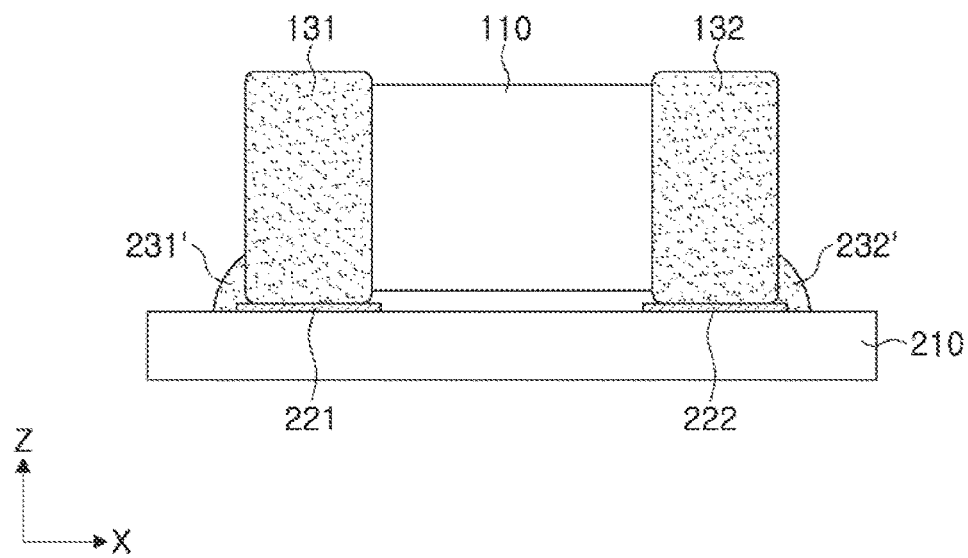
FIG. 8 is a schematic front view illustrating a two-terminal multilayer capacitor mounted on a circuit board without a connection terminal.
Figure 9:
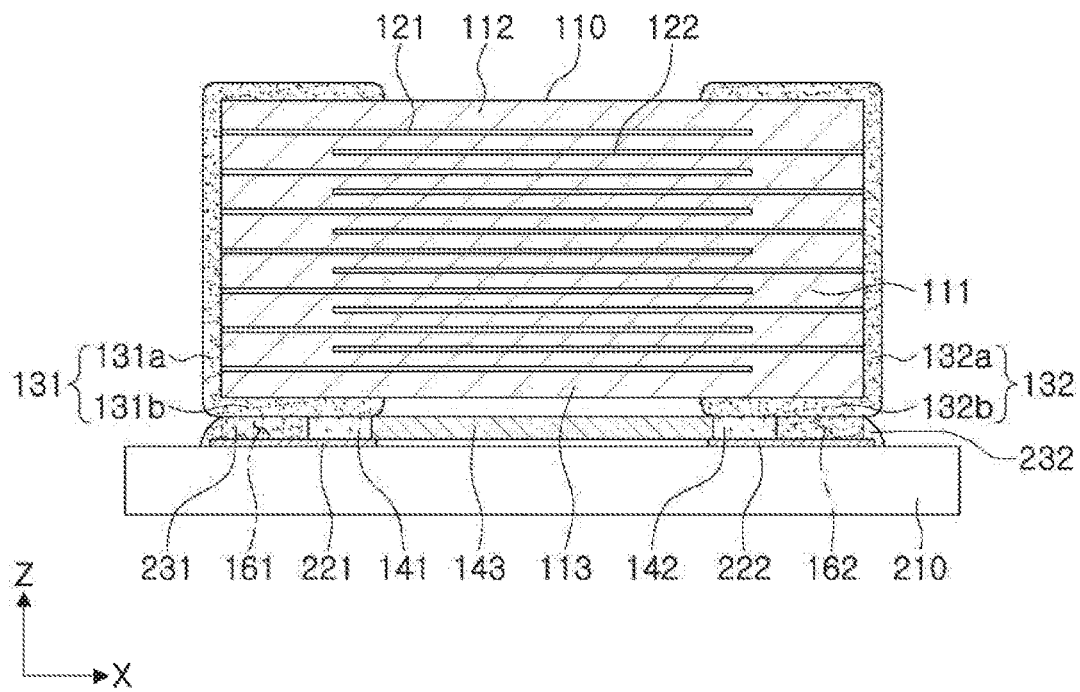
FIG. 9 is a schematic cross-sectional view illustrating a multilayer electronic component according to an exemplary embodiment mounted on a circuit board.

FIG. 8 is a schematic front view illustrating a two-terminal multilayer capacitor that is mounted on a circuit board without a connection terminal, and FIG. 9 is a schematic cross-sectional view illustrating the multilayer electronic component according to an exemplary embodiment mounted on a circuit board.

When voltages having different polarities are applied to the first and second external electrodes 131 and 132 formed on the multilayer electronic component 100 in a state in which the multilayer electronic component 100 is mounted on a circuit board 210, the capacitor body 110 may expand and contract in the Z direction due to an inverse piezoelectric effect of the dielectric layers 111, and both end portions of the first and second external electrodes 131 and 132 may contract and expand in opposition to the expansion and the contraction of the capacitor body 110 in the Z direction due to a Poisson effect.

Such a contraction and expansion may generate vibrations. In addition, the vibrations may be transferred from the first and second external electrodes 131 and 132 to the circuit board 210, and sound may thus be radiated from the circuit board 210, which becomes the acoustic noise.

Referring to FIG. 8, solders 231' and 232' are formed, respectively, between first and second external electrodes 131 and 132 of the multilayer capacitor and first and second electrode pads 221 and 222 formed on one surface of the circuit board 210. The solders 231' and 232', as formed, extend to a predetermined height toward a second surface of a capacitor body 110, such that a large amount of vibrations generated from the multilayer capacitor may be transferred to the circuit board.

Referring to FIG. 9, a board having a multilayer electronic component according to the present exemplary embodiment may include the circuit board 210 having first and second electrode pads 221 and 222 disposed on one surface thereof and the multilayer electronic component 100 mounted on an upper surface of the circuit board 210 so that the first and second land portions 141 and 142 are connected to the first and second electrode pads 221 and 222, respectively.

In the present exemplary embodiment, a case in which the multilayer electronic component 100 is mounted on the circuit board 210 by solders 231 and 232 is illustrated and described, but conductive pastes may be used instead of the solders, if desired.

According to the present exemplary embodiment, piezoelectric vibrations transferred to the circuit board through the first and second external electrodes 131 and 132 of the multilayer electronic component 100 may be absorbed through elasticity of the first and second land portions 141 and 142 including insulators formed of a soft material, and acoustic noise may thus be reduced.

Here, the first and second solder accommodating portions 161 and 162 provided by the first and second cut portions of the first and second land portions 141 and 142, respectively, and step portions provided by the bridge portion 143, may serve as the solder pockets that may trap the solders 231 and 232 on the first surface 1 of the capacitor body 110.

Therefore, the solders 231 and 232 may be more effectively trapped in the first and second solder accommodating portions 161 and 162 and the step portions, and heights of solder fillets extending toward the second surface of the capacitor body 110 may thus be reduced.

Therefore, a piezoelectric vibration transfer path of the multilayer electronic component 100 may be blocked. Additionally, the solder fillets and a maximum displacement point in the capacitor body 110 may be spaced apart from each other, so as to significantly improve an acoustic noise reducing effect of the multilayer electronic component 100 as compared to a structure of FIG. 8.

In addition, according to the structure of the multilayer electronic component of the present exemplary embodiment as described above, a vibration amount of the piezoelectric vibrations of the multilayer electronic component transferred to the circuit board at an audio frequency within 20 kHz of the multilayer electronic component may be effectively suppressed by the acoustic noise reducing structure described above.

Therefore, high frequency vibrations of the multilayer electronic component may be reduced to prevent malfunctions of sensors that may be caused by high frequency vibrations in a high frequency region of 20 kHz or more of the multilayer electronic component in information technology (IT) or industry/electrical component fields and suppress accumulation of internal fatigue of the sensors due to vibrations for a long period of time.

As set forth above, according to the exemplary embodiments, acoustic noise in an audio frequency region less than 20 kHz and the high frequency vibrations in the high frequency region of 20 kHz or more of the multilayer electronic component may be reduced.

While exemplary embodiments have been shown and described above, it will be apparent to those skilled in the art that modifications and variations could be made without departing from the scope of the present invention as defined by the appended claims.

What is claimed is:

1. A multilayer electronic component comprising:
   a capacitor body;
   a plurality of external electrodes disposed on a mounting surface of the capacitor body to be spaced apart from each other; and
   a connection terminal including land portions formed of insulators, having conductor layers formed on surfaces thereof, and disposed on respective external electrodes of the plurality of external electrodes, and a bridge portion disposed between and contacting land portions adjacent to each other,
   wherein cut portions are disposed in the land portions.

2. The multilayer electronic component of claim 1, wherein the capacitor body has a first surface corresponding to the mounting surface, a second surface opposing the first surface, and third and fourth surfaces connected to the first and second surfaces and opposing each other, and the capacitor body includes first and second internal electrodes each having one end alternately exposed through the third and fourth surfaces,
   the external electrodes include first and second external electrodes including, respectively, first and second band portions disposed on the first surface to be spaced apart from each other and first and second connected portions each extended from the first and second band portions respectively to the third and fourth surfaces respectively and each connected to the first and second internal electrodes respectively, and
   the land portions include first and second land portions respectively disposed on the first and second band portions and respectively having first and second cut portions disposed in opposing surfaces thereof respectively facing the third and fourth surfaces.

3. The multilayer electronic component of claim 2, wherein the capacitor body has fifth and sixth surfaces connected to the first and second surfaces, connected to the third and fourth surfaces, and opposing each other,
   the first external electrode is further extended to portions of the second, fifth, and sixth surfaces of the capacitor body, and
   the second external electrode is further extended to portions of the second, fifth, and sixth surfaces of the capacitor body.

4. The multilayer electronic component of claim 1, wherein the land portions are spaced apart from each other in a length direction, and the bridge portion has a width, measured in a width direction orthogonal to the length direction, smaller than a width of the land portion measured in the width direction, and has a linear shape.

5. The multilayer electronic component of claim 1, wherein the bridge portion has a cross shape.

6. The multilayer electronic component of claim 1, wherein a solder accommodating portion is provided by the cut portion on one surface of the external electrode.

7. The multilayer electronic component of claim 1, wherein the capacitor body has a first surface corresponding to the mounting surface, a second surface opposing the first surface, third and fourth surfaces connected to the first and second surfaces and opposing each other, and fifth and sixth surfaces connected to the first and second surfaces, connected to the third and fourth surfaces, and opposing each other, and the capacitor body includes first and second internal electrodes alternately disposed with respective dielectric layers interposed therebetween,
   the external electrodes include first, third, and second external electrodes disposed on the first surface to be spaced apart from one another in a direction connecting the third and fourth surfaces to each other and each extended to portions of the fifth and sixth surfaces of the capacitor body,
   each of the first internal electrodes has first and second lead portions exposed through the fifth or sixth surface of the capacitor body to thus be connected, respectively, to the first and second external electrodes,
   each of the second internal electrodes has a third lead portion disposed between the first and second lead portions and exposed through the fifth or sixth surface of the capacitor body to thus be connected to the third external electrode,
   the land portions include first, second, and third land portions disposed, respectively, on the first, second, and third external electrodes, and
   first and second cut portions formed in opposing surfaces of the first and second land portions, respectively, and facing in the direction of the third and fourth surfaces, respectively.

8. A board having a multilayer electronic component, comprising:
   a circuit board having a plurality of electrode pads disposed on one surface thereof; and
   the multilayer electronic component of claim 1 mounted on the circuit board so that the land portions are connected to respective electrode pads of the plurality of electrode pads.

9. A multilayer electronic component comprising:
   a capacitor body;
   a plurality of external electrodes disposed on a mounting surface of the capacitor body to be spaced apart from each other; and
   a connection terminal including land portions formed of insulators, having conductor layers formed on surfaces thereof, and disposed on respective external electrodes of the plurality of external electrodes, and a bridge portion disposed between land portions adjacent to each other,
   wherein cut portions are disposed in the land portions,
   the capacitor body has a first surface corresponding to the mounting surface, a second surface opposing the first surface, and third and fourth surfaces connected to the first and second surfaces and opposing each other, and the capacitor body includes first and second internal electrodes alternately disposed with respective dielectric layers interposed therebetween, the external electrodes include first, third, and second external electrodes disposed on the first surface to be spaced apart from one another in a direction connecting the third and fourth surfaces to each other, each of the first internal electrodes has first and second lead portions exposed through the first surface of the capacitor body to thus be connected, respectively, to the first and second external electrodes, each of the second internal electrodes has a third lead portion disposed between the first and second lead portions and exposed through the first surface of the capacitor body to thus be connected to the third external electrode, the land portions include first, second, and third land portions disposed, respectively, on the first, second, and third external electrodes, and first and second cut portions are disposed, respectively, in opposing surfaces of the first and second land portions facing the third and fourth surfaces.

10. The multilayer electronic component of claim 9, wherein the bridge portion includes a first bridge portion disposed between the first land portion and the third land portion and a second bridge portion disposed between the second land portion and the third land portion, and the first and second bridge portions are formed to each have a width smaller than a width of the first, second, and third land portions, and to each have a linear shape.

11. The multilayer electronic component of claim 9, wherein the capacitor body has fifth and sixth surfaces connected to the first and second surfaces, connected to the third and fourth surfaces, and opposing each other, the first external electrode is further extended to the third surface and portions of the second, fifth, and sixth surfaces of the capacitor body, the second external electrode is further extended to the fourth surface and portions of the second, fifth, and sixth surfaces of the capacitor body, and the third external electrode is further extended to portions of the fifth, sixth and second surfaces of the capacitor body.

12. A multilayer electronic component comprising:
a capacitor body including a plurality of first and second internal electrodes alternately disposed therein with dielectric layers disposed therebetween;
a plurality of external electrodes disposed on a mounting surface of the capacitor body to be spaced apart from each other; and
a connection terminal including land portions formed of insulators, having conductor layers formed on surfaces thereof, and disposed on respective external electrodes of the plurality of external electrodes, and a bridge portion disposed between and having opposing ends each contacting a respective land portion of the land portions disposed on the respective external electrodes,
wherein each land portion has an outline including a concave portion.

13. The multilayer electronic component of claim 12, wherein the concave portions of the land portions are formed in side surfaces of the land portions facing away from each other.

14. The multilayer electronic component of claim 12, wherein the plurality of external electrodes includes first and second external electrodes each extending onto opposing first and second end surfaces of the capacitor body, and
the concave portion of one land portion is formed in a side surface of the one land portion facing the first end surface, and the concave portion of another land portion is formed in a side surface of the other land portion facing the second end surface.

15. The multilayer electronic component of claim 12, wherein the concave portion of each land portion is formed in a side surface of the land portion facing away from the bridge portion.

16. The multilayer electronic component of claim 15, wherein the external electrodes are spaced apart from each other in a length direction of the capacitor body, and
the bridge portion has a width measured in a direction orthogonal to the length direction that is smaller than a width of the land portions measured in the direction orthogonal to the length direction.

17. The multilayer electronic component of claim 15, wherein the bridge portion has a '+' shape.

18. The multilayer electronic component of claim 12, wherein the plurality of external electrodes comprises three external electrodes spaced apart from each other on the mounting surface of the capacitor body.

19. The multilayer electronic component of claim 18, wherein each external electrode extends onto at least 4 outer surfaces of the capacitor body.

20. The multilayer electronic component of claim 12, wherein the plurality of external electrodes comprises three external electrodes spaced apart from each other on the mounting surface of the capacitor body, and each first internal electrode contacts at least two of the external electrodes.

* * * * *